SEMICONDUCTOR SIGNAL TRANSLATING DEVICES

Filed June 12, 1953 2 Sheets-Sheet 1

INVENTOR
R. J. KIRCHER
BY [signature]
ATTORNEY

SEMICONDUCTOR SIGNAL TRANSLATING DEVICES

Filed June 12, 1953 2 Sheets-Sheet 2

INVENTOR
R. J. KIRCHER
BY [signature]
ATTORNEY

United States Patent Office 2,795,744

Patented June 11, 1957

2,795,744

SEMICONDUCTOR SIGNAL TRANSLATING DEVICES

Reymond J. Kircher, Summit, N. J., assignor to Bell Telephone Laboratories, Incorporated, New York, N. Y., a corporation of New York Application June 12, 1953, Serial No. 361,226

1 Claim. (Cl. 317—235)

This invention relates to semiconductor signal translating devices and more particularly to semiconductor amplifiers of the class now known as transistors.

Transistors such as disclosed in Patent 2,524,035, granted October 3, 1950 to J. Bardeen and W. H. Brattain comprise, in general, a body of semiconductive material, a pair of point contacts, termed the emitter and collector, bearing against one face of the body, and a large area substantially ohmic connection, termed the base, to the body. Performance characteristics of such transistors are discussed in some detail in the article "Some circuit aspects of the transistor," by R. M. Ryder and R. J. Kircher, Bell System Technical Journal, volume 28, page 367, July 1949.

Two of these characteristics of particular moment in a variety of applications of transistors are the base resistance and the current multiplication factor, commonly referred to as alpha ($\alpha$).

One general object of this invention is to improve the performance characteristics of transistors of the general type above described.

More specifically, objects of this invention are to enable control of the several characteristic resistances of transistors, including the base resistance, to obtain a low base resistance, and to enhance the current multiplication factor, $\alpha$, of such devices.

In accordance with one feature of this invention, in a transistor of the general construction above described, the semiconductive body is constructed to have therein an NP junction and the collector is treated to provide thereadjacent a barrier region which extends into proximity to but does not meet nor intersect the junction.

In one illustrative embodiment of this invention, the emitter and collector bear against one face of the semiconductive body and the base connection is made to the opposite face. The junction extends through the body between the two faces thereby to provide a PN diode physically in series between the collector and base. The junction diode is poled so that for the normal polarity of collector bias, the diode is biased in the forward or low resistance direction. For example, the body may be a disc or wafer having contiguous N and P zones, the emitter and collector bear against the N zone and the base connection is made to the P zone. The normal bias on the collector is negative relative to the base so that the NP junction diode is biased in the forward direction.

The treatment of the collector electrode aforementioned comprises electrically forming the collector contact, specifically by applying a relatively high current pulse or pulses in the reverse direction between the contact and the body. Such treatment results in the creation adjacent the collector contact of a barrier region of extent depending upon the forming treatment.

The invention and the above noted and other features thereof will be understood more clearly and fully from the following detailed description with reference to the accompanying drawing in which.

Figure 1:
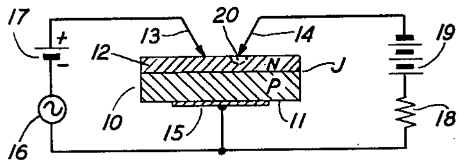
Fig. 1 is a diagram depicting a transistor illustrative of one embodiment of this invention.
Figure 6:
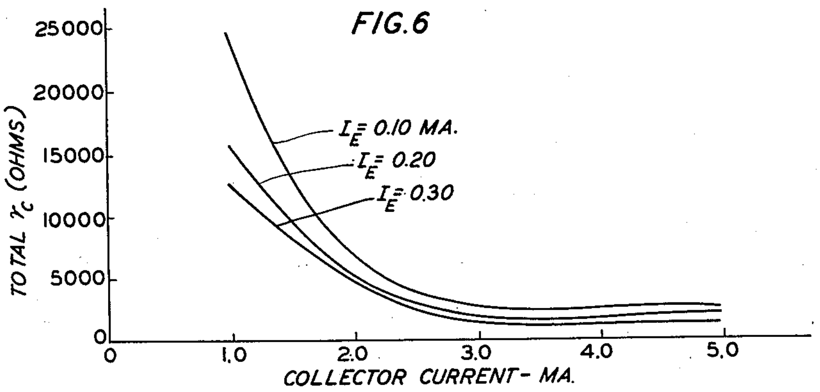
Figure 7:
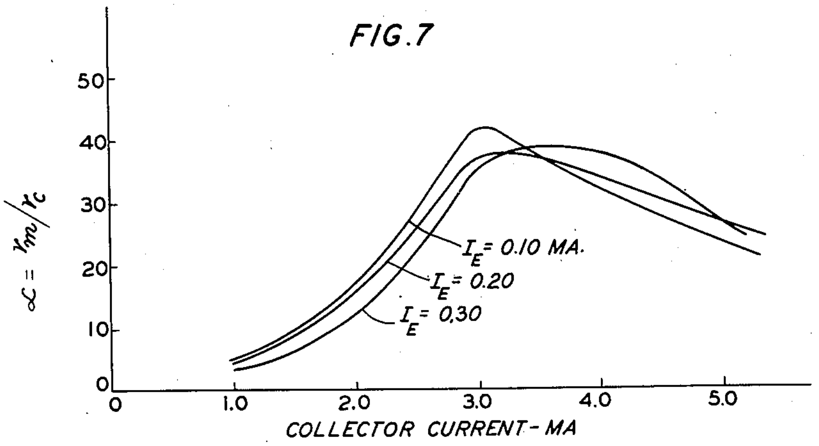
Figure 8:
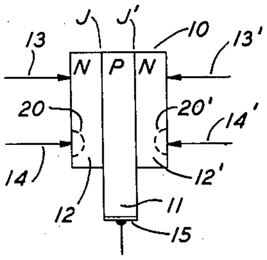
Figure 9:
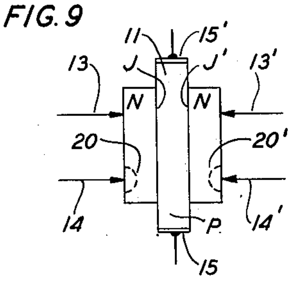

Figs. 3 to 7 inclusive are graphs representing performance characteristics of typical devices constructed in accordance with this invention; and Figs. 8 and 9 are elevational views portraying modifications of the embodiment of this invention illustrated in Fig. 1.

Referring now to the drawing, the signal translating device depicted in Fig. 1 comprises a semiconductive body 10, for example of germanium or silicon, having therein a P conductivity type zone 11, and an N type zone 12, the two zones being contiguous and defining a junction J. Advantageously, the body, which may be a disc or wafer, is of single crystal construction. It may be fabricated, for example, in the manner disclosed in the application Serial No. 168,184, filed June 15, 1950 of G. K. Teal, now Patent 2,727,840, issued December 20, 1955.

Bearing against the N zone 12 are a pair of point contacts 13 and 14 which constitute the emitter and collector respectively, the two being in close juxtaposition, spaced for example of the order of 2 or 3 mils. The emitter contact 13 may be of beryllium copper and the collector contact 14 of Phosphor bronze. A third connection, the base, 15, for example a plating of rhodium or a coating of lead-tin solder, is made to the P zone 11.

During operation of the device, signals as from a source 16 are impressed between the emitter 13 and base 15, the input circuit including a source 17 for biasing the emitter 13 in the forward direction relative to the zone 12. A load circuit is connected between the base 15 and collector 14 and comprises a load represented by the resistor 18 and a source 19 for biasing the collector 14 in the reverse direction relative to the zone 12. Typical values for the emitter and collector biases will be indicated hereinafter.

Figure 2:
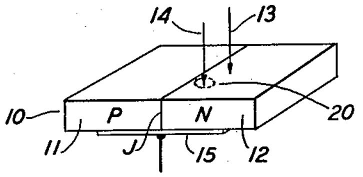
Fig. 2 is a perspective view of a transistor illustrative of another embodiment of this invention.
Figure 3:
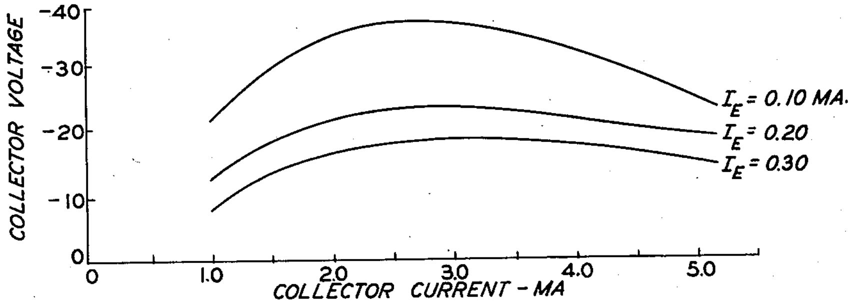

In the embodiment of this invention illustrated in Fig. 2, the emitter 13 and collector 14 bear against the N zone 12 in immediate proximity to the junction J. In a typical device, the emitter and collector may be aligned parallel to the junction J, and spaced approximately 0.50 mil therefrom. The base connection 15 engages both the N and P zones. In the operation of the device of Fig. 2, the emitter and collector are biased and function in the same manner as in the transistor portrayed in Fig. 1 and described hereinabove.

In the fabrication of transistors of the constructions portrayed in Figs. 1 and 2, the collector contact is subjected to an electrical forming treatment, for example such as disclosed in the applications Serial No. 67,781, filed December 29, 1948 of W. H. Brattain, now Patent 2,663,829 issued December 22, 1953, and Serial No. 250,160, filed October 6, 1951 of A. E. Anderson now Patent 2,746,121, issued May 22, 1956. In brief, such electrical forming comprises establishing a prescribed emitter current and applying a relatively high current pulse or pulses in the reverse direction between the collector and base until the reverse collector characteristic is of a prescribed form, e. g., such that collector current saturation occurs at a preassigned collector voltage and emitter current. The physics of what occurs during the forming is not known precisely. However, it is known that this treatment results in the establishment immediately adjacent the collector of a region, designated as 20 in Figs. 1 and 2 and herein referred to as a barrier region, of conductivity substantially different from that of the N zone 12, that is a region which is less strongly N type than the zone 12 or even P type. The depth and extent of this region are dependent upon the forming current, specifically increase as the forming current increases.

In devices constructed in accordance with this invention, the collector is formed so that the barrier region 20 extends into proximity to but does not intersect the junction J. The limit of forming current which will establish this condition may be determined by successive pulses of forming current, after each of which the desired characteristic is examined. In a specific device of the construction represented in Fig. 1, wherein the N zone 12 was .005 inch thick and of about 3.0 ohm centimeter resistivity, forming currents from a condenser, .01 microfarad, charged to 300 volts, and discharged through 1,000 ohms to collector have been found satisfactory.

Performance characteristics of typical devices constructed in accordance with this invention are represented graphically in Figs. 3 to 7. The first figure of these depicts the collector current-collector voltage relationship for three values of emitter current; each of the other figures presents the relationship between a particular operating parameter (plotted as ordinate) and the collector current (plotted as abscissae) for these three values of emitter current. The latter are indicated on the curves. Several relationships are to be noted particularly.

Figure 4:
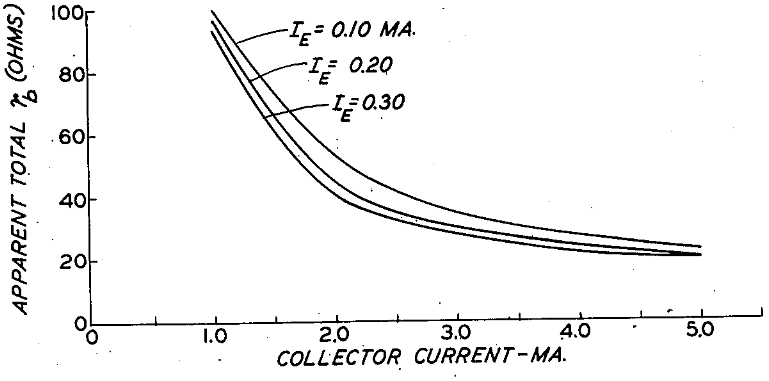

As is clear from Fig. 4, for low values of collector current, the base resistance, $r_b$, is high, of the order of 100 ohms. However, it decreases markedly, specifically to about 20 ohms at a collector current of 5 milliamperes. This characteristic is particularly useful in applications where controllable or low base resistance is desired and also in oscillatory circuits where a self-starting property is required. In the latter case, for example, the device may be triggered, in effect, from a low $r_b$ and, hence, stable condition to a relatively high $r_b$ and, hence, relatively unstable or oscillatory state.

Figure 5:
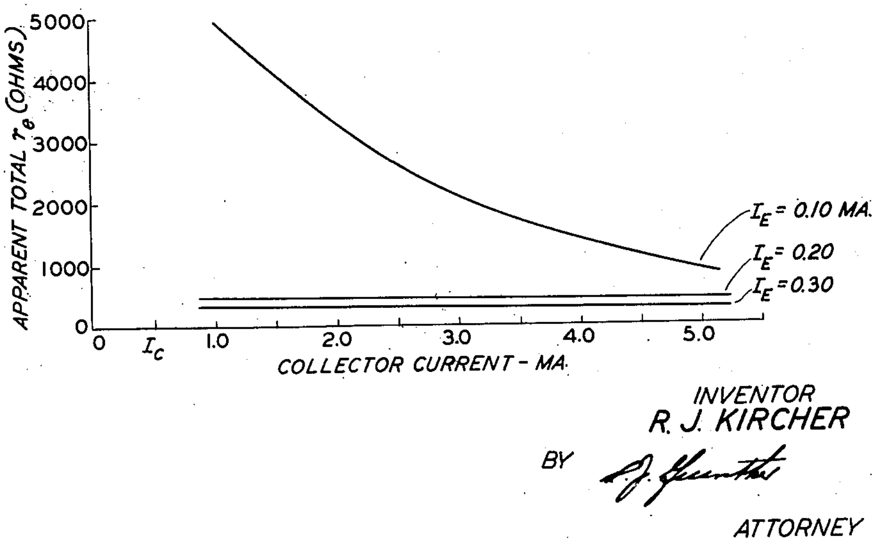

From Fig. 5 it will be noted that although for low emitter current (0.10 milliampere) the emitter resistance, $r_e$, decreases as the collector current increases, for higher values of $I_E$, the emitter resistance remains substantially constant over a wide range of collector currents. This constancy, particularly in conjunction with the low values of $r_b$ indicated in Fig. 4, leads to high stability, particularly in the case of grounded base operation such as illustrated in Fig. 1.

To be noted particularly in Fig. 6 is the fact that the collector resistance, $r_c$ is very low, of the order of 3,000 to 5,000 ohms, and essentially contant over a range of collector currents, say from 3 milliamperes to 5 milliamperes and higher.

Fig. 7 depicts graphically an especially advantageous feature of devices constructed in accordance with this invention, to wit the large amplification factor, $\alpha$, obtainable. Specifically, it will be noted that this parameter reaches a maximum of between about 35 and 40 for a collector current of about 3 milliamperes and remains large for higher collector currents.

Although the invention is not to be limited thereby, the following analysis of the physics of operation of devices constructed in accordance with this invention is explicable of the performance characteristics obtained and represented in Figs. 3 to 7. As has been noted hereinabove, the electrical forming of the collector produces a barrier region 20 adjacent the collector and extending into proximity to the junction J. The extent of this region may be varied with the emitter current. With the region in proximity to the junction, the latter, which it will be noted is biased in the forward direction, acts as an auxiliary source of holes which flow to the collector. The controlling primary source of holes, of course, is the emitter. The auxiliary hole current, that is that due to injection of holes from the P zone into the N zone, is controlled by the input signal, more particularly by the hole current from emitter to the collector.

As illustrated in Fig. 8, the invention may be embodied also in compound transistors of the general type disclosed in the application Serial No. 110,726, filed August 17, 1949 of R. J. Kircher, now Patent 2,644,914 issued July 7, 1953. As shown in this figure, the semiconductive body 10 comprises a P zone 11 between a pair of N zones 12 and 12′ and forming junctions J and J′ therewith. Emitter and collector contacts 13 and 14 bear against the N zone 12 and a second pair of emitter and collector contacts 13′ and 14′ bear against the zone 12′. Both of the collectors are formed electrically as described hereinabove to produce the barrier regions 20 and 20′. The base 15 is common to the two transistor units.

The invention may be embodied also in transistors of the general type disclosed in the application Serial No. 294,298, filed June 19, 1952 of R. L. Wallace, now Patent 2,695,930, issued November 20, 1954, as portrayed in Fig. 9. As shown in this figure, the base zone 11 is provided with a pair of contacts 15 and 15′ at opposite extremities thereof by way of which a biasing current may be passed through the zone 11. Such current controls the effective area of the junctions J and $J_1$ and thereby the hole injection across the junctions into the N zones 12 and 12′.

Although specific embodiments of the invention have been shown and described, it will be understood that they are but illustrative and that various modifications may be made therein without departing from the spirit and scope of the invention.

What is claimed is:

A signal translating device comprising a body of semiconductive material having therein an N zone and a P zone contiguous with said N zone and defining a junction therewith, a base connection common to both said zones, point contact emitter and collector connections to one of said zones, said emitter and collector connections positioned on a line parallel to and spaced about 0.50 mil from said junction, said emitter connection having a spacing of about two mils from said collector connection, said collector connection having thereunder a barrier region extending into proximity to but not intersecting said junction.

References Cited in the file of this patent

UNITED STATES PATENTS

| | | |
|---|---|---|
| 2,502,479 | Pearson et al. | Apr. 4, 1950 |
| 2,524,035 | Bardeen et al. | Oct. 3, 1950 |
| 2,561,411 | Pfann | July 24, 1951 |
| 2,570,978 | Pfann | Oct. 9, 1951 |
| 2,586,080 | Pfann | Feb. 19, 1952 |
| 2,623,103 | Kircher | Dec. 23, 1952 |